(12) United States Patent
Lee et al.

(10) Patent No.: US 9,070,852 B2
(45) Date of Patent: Jun. 30, 2015

(54) LIGHT EMITTING DEVICE PACKAGE AND MANUFACTURING METHOD THEREOF

(75) Inventors: Sang Hyun Lee, Suwon-si (KR); Seong Deok Hwang, Seoul (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 581 days.

(21) Appl. No.: 13/295,850

(22) Filed: Nov. 14, 2011

(65) Prior Publication Data

US 2012/0138988 A1 Jun. 7, 2012

(30) Foreign Application Priority Data

Dec. 2, 2010 (KR) .................... 10-2010-0121990

(51) Int. Cl.
*H01L 33/00* (2010.01)
*H01L 33/62* (2010.01)
*H01L 33/22* (2010.01)

(52) U.S. Cl.
CPC ............ *H01L 33/62* (2013.01); *H01L 33/0079* (2013.01); *H01L 33/22* (2013.01); *H01L 2933/0066* (2013.01); *H01L 2924/0002* (2013.01)

(58) Field of Classification Search
CPC ...... H01L 33/0079; H01L 33/22; H01L 33/62
USPC .................... 438/667; 257/E33.057
See application file for complete search history.

(56) References Cited

U.S. PATENT DOCUMENTS

| 6,333,522 | B1 | 12/2001 | Inoue et al. | |
| 7,436,000 | B2* | 10/2008 | Kim et al. | 257/98 |
| 2003/0062530 | A1 | 4/2003 | Okazaki et al. | |
| 2003/0173683 | A1* | 9/2003 | Ohuchi | 257/782 |
| 2006/0006404 | A1 | 1/2006 | Ibbetson et al. | |
| 2006/0261364 | A1 | 11/2006 | Suehiro et al. | |
| 2007/0102827 | A1* | 5/2007 | Hogerton et al. | 257/778 |
| 2010/0065949 | A1* | 3/2010 | Thies et al. | 257/621 |

(Continued)

FOREIGN PATENT DOCUMENTS

| CN | 1759492 A | 4/2006 |
| CN | 101032034 A | 9/2007 |

(Continued)

OTHER PUBLICATIONS

Extended European Search Report issued in European Patent Application No. 11191558.3 issued on Nov. 28, 2013.

(Continued)

*Primary Examiner* — Stephen W Smoot
*Assistant Examiner* — Sun M Kim
(74) *Attorney, Agent, or Firm* — Sughrue Mion, PLLC

(57) ABSTRACT

A light emitting device (LED) package and a manufacturing method thereof are provided. The LED package includes an LED including a first electrode pad and a second electrode pad disposed on one surface thereof; a bonding insulating pattern layer configured to expose the first electrode pad and the second electrode pad; a substrate including a via hole bored from a first surface to a second surface and a wiring metal layer formed on an inner surface of the via hole to extend to a part of the second surface; and a bonding metal pattern layer bonded to the wiring metal layer exposed through the via hole at the first surface of the substrate and also bonded to the first electrode pad and the second electrode pad.

6 Claims, 12 Drawing Sheets

(56) References Cited

U.S. PATENT DOCUMENTS

| | | | |
|---|---|---|---|
| 2010/0109025 A1* | 5/2010 | Bhat | 257/88 |
| 2010/0203657 A1 | 8/2010 | Kim | |
| 2010/0264454 A1* | 10/2010 | Yi et al. | 257/99 |
| 2012/0025241 A1* | 2/2012 | Xiao et al. | 257/98 |

FOREIGN PATENT DOCUMENTS

| | | |
|---|---|---|
| EP | 1 603 170 A1 | 12/2005 |
| EP | 2 355 196 A2 | 8/2011 |
| JP | 2006-521699 | 9/2006 |
| KR | 10-2006-0095271 A | 8/2006 |
| KR | 10-2010-0003336 A | 1/2010 |
| WO | 2005/064666 A1 | 7/2005 |

OTHER PUBLICATIONS

Chinese Office Action issued in Chinese Application No. 201110402793.6, dated Dec. 27, 2013.

Chinese Third Office Action issued in corresponding Chinese Patent Application No. 201110402793.6 on Mar. 6, 2015; 14 pages with English translation.

\* cited by examiner

LIGHT EMITTING DEVICE PACKAGE AND MANUFACTURING METHOD THEREOF

CROSS-REFERENCE TO RELATED APPLICATION

This application claims the benefit of Korean Patent Application No. 10-2010-0121990, filed on Dec. 2, 2010, in the Korean Intellectual Property Office, the disclosure of which is incorporated herein by reference.

BACKGROUND

1. Field

Example embodiments of the following description relate to a light emitting device (LED) package and a manufacturing method thereof, capable of reducing a size of a product and simplifying a manufacturing process by performing the manufacturing process at a wafer level.

2. Description of the Related Art

Recently, a light emitting device (LED) has been applied to small home appliances, interior goods, and further to various products including large-scale back light units (BLUs), general lighting devices, and electronic devices.

In those products applying the LED, increase in a degree of freedom of design is demanded. For example, size reduction of the LED is required to reduce a width of the BLU for a slimmer TV and to achieve various types of the general lighting and the electronic devices.

FIG. 1 illustrates a sectional view showing a structure of a conventional LED package 10. Referring to FIG. 1, the LED package 10 is structured by mounting an LED 14 on a package body 11.

The package body 11 includes a first lead frame 12 and a second lead frame 13 which are exposed through a bottom surface of a cavity 11a, disposed at an upper surface of the package body 11.

The LED 14 may include two electrode pads with different polarities, disposed on one surface. The two electrode pads are mounted on the package body 11 to be in contact with the first lead frame 12 and the second lead frame 13, respectively. A phosphor resin layer 15 is formed at the package body 11 including the LED 14. A lens unit 16 is disposed on the phosphor resin layer 15.

However, the LED package 10 as shown in FIG. 1 has a limitation in reducing a size of the LED package, since the package body 11 is relatively large compared to the LED 14. Also, in the products applying the LED package 10, an increase in a degree of freedom in design is limited.

In addition, since the LED 14 is mounted to the package body 11 as a separate chip, mass production becomes difficult. Also, the manufacturing process is complicated, accordingly increasing processing cost and time.

SUMMARY

According to example embodiments, there may be provided a light emitting device (LED) package and a manufacturing method thereof, capable of reducing size of a product and simplifying manufacturing processes, by performing the manufacturing processes in a wafer level, that is, by bonding a first substrate including a plurality of LEDs to a second substrate including a plurality of via holes and a wiring pattern layer formed in the via holes, using a bonding insulating pattern layer and a bonding metal pattern layer.

The foregoing and/or other aspects are achieved by providing a light emitting device (LED) package, including an LED including a first electrode pad and a second electrode pad disposed on one surface thereof; a bonding insulating pattern layer configured to expose the first electrode pad and the second electrode pad; a substrate including a via hole bored from a first surface to a second surface and a wiring metal layer formed on an inner surface of the via hole to extend to a part of the second surface; and a bonding metal pattern layer bonded to the wiring metal layer exposed through the via hole at the first surface of the substrate and also bonded to the first electrode pad and the second electrode pad.

The LED may include a light emission structure including a first nitride-based semiconductor layer and a second nitride-based semiconductor layer, and having a mesa structure that exposes a part of the first nitride-based semiconductor layer; the first electrode pad disposed on the first nitride-based semiconductor layer being exposed; the second electrode pad disposed on the second nitride-based semiconductor layer; a phosphor resin layer disposed on a light extraction surface of the first nitride-based semiconductor layer; and a lens unit disposed on the phosphor resin layer.

The light extraction surface of the first nitride-based semiconductor layer may include an uneven surface pattern.

The via hole formed on the substrate may have a diameter increasing from the first surface toward the second surface such that the inner surface has an inclination angle of about 65° to about 90°.

The wiring metal layer may be formed with a uniform thickness on the inner surface of the via hole and the same shape as an inside of the via hole.

The foregoing and/or other aspects are achieved by providing a method for manufacturing an LED package including preparing a first substrate that includes a plurality of LEDs each formed with a first electrode pad and a second electrode pad disposed on one surface thereof, and includes a bonding insulating pattern layer configured to expose the first electrode pad and the second electrode pad; preparing a second substrate that includes a plurality of via holes bored from a first surface to a second surface, and a wiring metal layer formed on inner surfaces of the plurality of via holes, extending to a part of the second surface; forming a bonding metal pattern layer to be bonded to the wiring metal layer exposed through the plurality of via holes at the first surface of the second substrate; mounting the first substrate to the second substrate such that the first electrode pad and the second electrode pad face the bonding metal pattern layer; bonding the first substrate and the second substrate; and manufacturing the LED package separated into unit chips by processing the first substrate and the second substrate.

The preparing of the first substrate may include forming a light emission structure including a first nitride-based semiconductor layer, an active layer, and a second nitride-based semiconductor layer, on a sapphire substrate; etching the active layer and the second nitride-based semiconductor layer so that a part of the first nitride-based semiconductor layer is exposed; forming the first electrode pad on the first nitride-based semiconductor layer and forming the second electrode pad on the second nitride-based semiconductor layer; forming a bonding insulating material on one surface where the first electrode pad and the second electrode pad are formed; and forming the bonding insulating pattern layer by patterning the bonding insulating material so that the first electrode pad and the second electrode pad are exposed.

The manufacturing of the LED package separated into unit chips, may include exposing the first nitride-based semiconductor layer by removing the sapphire substrate from the light emission structure constituting the first substrate; forming an uneven surface pattern on the first nitride-based semiconductor layer being exposed; applying a phosphor resin on the first nitride-based semiconductor layer formed with the uneven surface pattern; applying a transparent resin on the phosphor resin; and cutting the first substrate and the second substrate into separate unit chips.

The preparing of the second substrate may include forming the plurality of via holes by etching a conductive substrate; forming an insulating layer on a surface of the conductive substrate formed with the plurality of via holes; forming a metal seed layer on the insulation layer, the metal seed layer extending from an inner surface of each of the plurality of via holes to the second surface; and forming the wiring metal layer by plating the metal seed layer with a metal material extending from an inner surface of each of the plurality of via holes to a part of the second surface.

The plurality of via holes may each have a diameter increasing from the first surface toward the second surface such that the inner surface has an inclination angle of about 65° to about 90°.

The forming of the wiring metal layer may be performed by plating the metal seed layer with a uniform thickness of the metal material into the same shape as an inside of each of the plurality of via holes.

The forming of the bonding metal pattern layer may be performed such that the bonding metal pattern layer is meshed with the first electrode pad and the second electrode pad exposed through the bonding insulating pattern layer at the first substrate and such that an outer surface of the bonding metal pattern layer is separated from the bonding insulating pattern layer.

The foregoing and/or other aspects are also achieved by providing a method for manufacturing an LED package, including preparing a first substrate that includes a plurality of LEDs each formed with a first electrode pad and a second electrode disposed on one surface thereof, and includes a bonding metal pattern layer formed on the first electrode pad and the second electrode pad; preparing a second substrate that includes a plurality of via holes bored from a first surface to a second surface, and a wiring metal layer extending from an inner surface of each of the plurality of via holes to a part of the second surface; forming a bonding insulating pattern layer in a region except the plurality of via holes on the first surface of the second substrate; mounting the first substrate on the second substrate such that the bonding insulating pattern layer faces the wiring metal layer exposed through the plurality of via holes at the first surface of the second substrate; bonding the first substrate and the second substrate; and manufacturing the LED package separated into unit chips by processing the first substrate and the second substrate being bonded.

Additional aspects, features, and/or advantages of example embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the example embodiments, taken in conjunction with the accompanying drawings of which.

DETAILED DESCRIPTION

Figure 1:
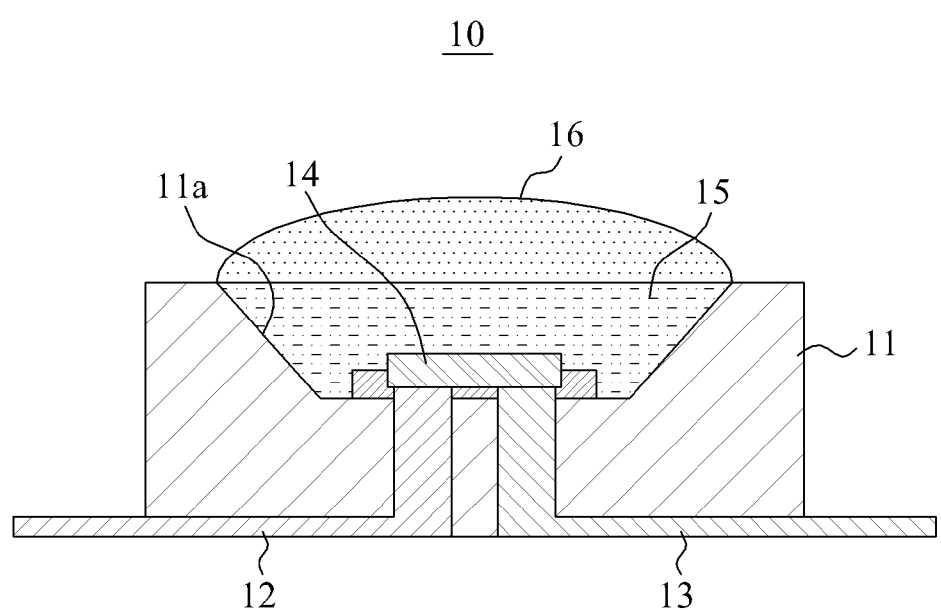
FIG. 1 illustrates a sectional diagram showing a structure of a conventional light emitting device (LED) package according to example embodiments.

Reference will now be made in detail to exemplary embodiments of the present invention, examples of which are illustrated in the accompanying drawings. In the description of the present invention, if detailed descriptions of related disclosed art or configuration are determined to unnecessarily make the subject matter of the present invention obscure, they will be omitted. Terms to be used below are defined based on their functions in the present invention and may vary according to users, user's intentions, or practices. Therefore, the definitions of the terms should be determined based on the entire specification. Like reference numerals refer to the like elements throughout.

Figure 2:
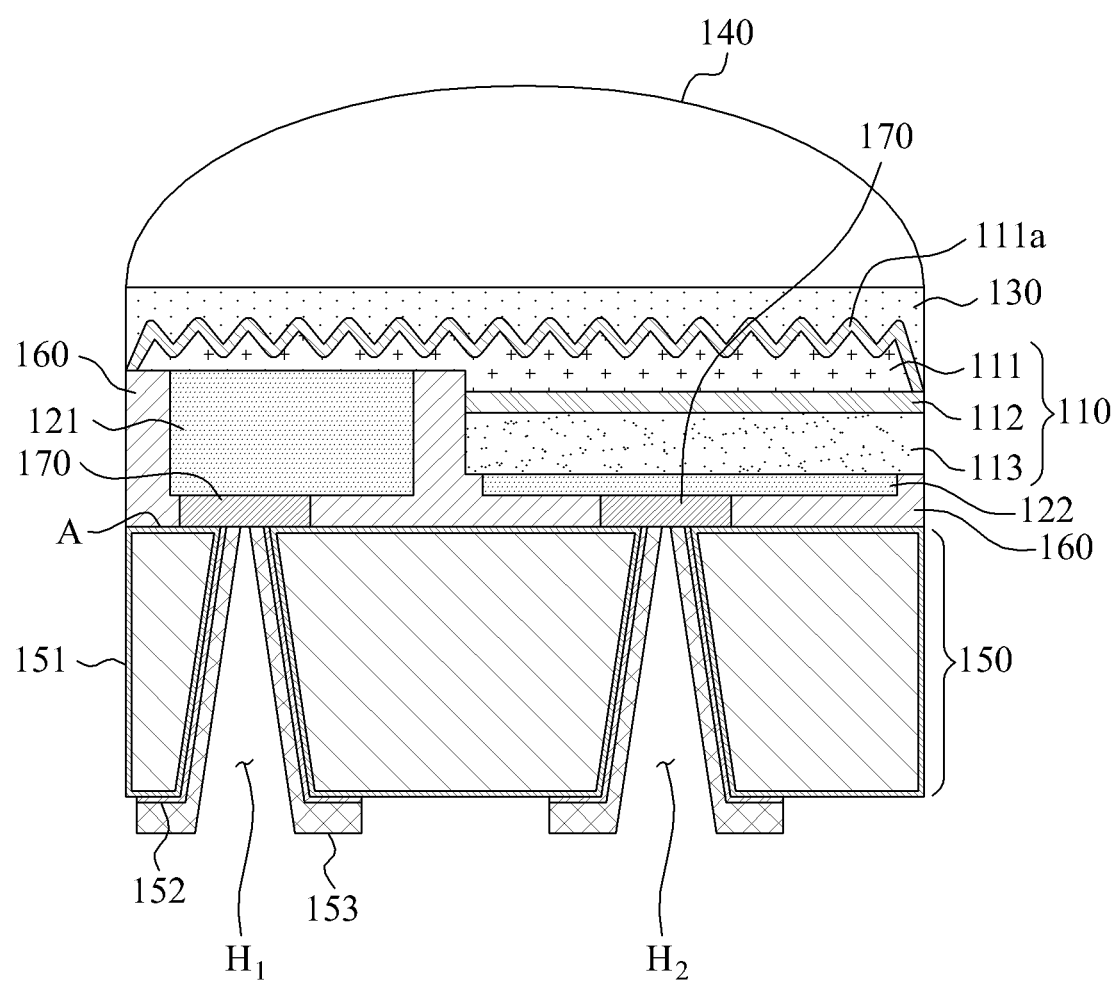
FIG. 2 illustrates a sectional view showing a structure of an LED package according to example embodiments.

FIG. 2 illustrates a sectional view showing a structure of a light emitting device (LED) package 100 according to example embodiments. Referring to FIG. 2, the LED package 100 is structured by bonding an LED to a substrate 150.

The LED includes a light emission structure 110 including a first nitride-based semiconductor layer 111, an active layer 112, and a second nitride-based semiconductor layer 113. The light emission structure 110 has a mesa structure that exposes a part of the first nitride-based semiconductor layer 111.

The first nitride-based semiconductor layer 111 and the second nitride-based semiconductor layer 113 may include semiconductor materials such as GaN, InGaN, AlGaN, and the like. An uneven surface pattern 111a may be formed on a light extraction surface, that is, one surface of the first nitride-based semiconductor layer 111 opposite to the other surface contacting the active layer 112. The uneven surface pattern 111a may prevent loss of light generated from the active layer 112, thereby increasing light extraction efficiency of the light extraction surface.

The LED may include a first electrode pad 121 disposed on the first nitride-based semiconductor layer 111 being exposed, and a second electrode pad 122 disposed on the second nitride-based semiconductor layer 113.

The LED may further include a phosphor resin layer 130 disposed on the light extraction surface of the first nitride-based semiconductor layer 111, and a lens unit 140 disposed on the phosphor resin layer 130.

The substrate 150 may include via holes H1 and H2 bored from a first surface to a second surface of the substrate 150, an insulating layer 151 disposed on an overall surface of the substrate 150 including the via holes H1 and H2, a metal seed layer 152 disposed on the insulating layer 151 to extend from inner surfaces of the via holes H1 and H2 to a part of the second surface, and a wiring metal layer 153 disposed on the metal seed layer 152.

The via holes H1 and H2 may be disposed in a region on the substrate 150, to correspond to the first electrode pad 121 and the second electrode pad 122 of the LED. Inner surfaces of the via holes H1 and H2 may be inclined by an angle of about 65° to about 90°. That is, the via holes H1 and H2 may each have a diameter increasing from the first surface toward the second surface of the substrate 150.

The wiring metal layer 153 may be formed to a uniform thickness on the inner surfaces of the via holes H1 and H2, to have the same shape as insides of the via holes H1 and H2. In other words, the wiring metal layer 153 is formed through the substrate 150 by extending from the first surface to the second surface of the substrate 150, in the same manner as the insides of the via holes H1 and H2, rather than filling the insides of the via holes H1 and H2.

The LED package 100 may be structured by bonding the LED to the substrate 150 using a bonding insulating pattern layer 160 and a bonding metal pattern layer 170.

The bonding insulating pattern layer 160 may be configured to expose the first electrode pad 121 and the second electrode pad 122 disposed on one surface of the LED. The bonding insulating pattern layer 160 may be disposed in a region except the via holes H1 and H2 on the first surface of the substrate 150.

The bonding metal pattern layer 170 may be disposed on the first electrode pad 121 and the second electrode pad 122 included in the one surface of the LED, and also on the wiring metal layer 153 exposed through the via holes H1 and H2 at the first surface of the substrate 150. That is, the bonding metal pattern layer 170 may be meshed with the bonding insulating pattern layer 160, thereby forming a glue layer along with the bonding insulating pattern layer 160 contacting an outer surface of the bonding metal pattern layer 170.

Since the LED and the substrate 150 are thus bonded using the bonding insulating pattern layer 160 and the bonding metal pattern layer 170, bonding reliability may increase.

In addition, since the wiring metal layer 153 has the same shape as the insides of the via holes H1 and H2 of the substrate 150, a residual stress remaining on the substrate 150 and out-gassing may be reduced.

FIGS. 3 through 13 illustrate sectional diagrams explaining a manufacturing method for an LED package, according to example embodiments.

Figure 3:
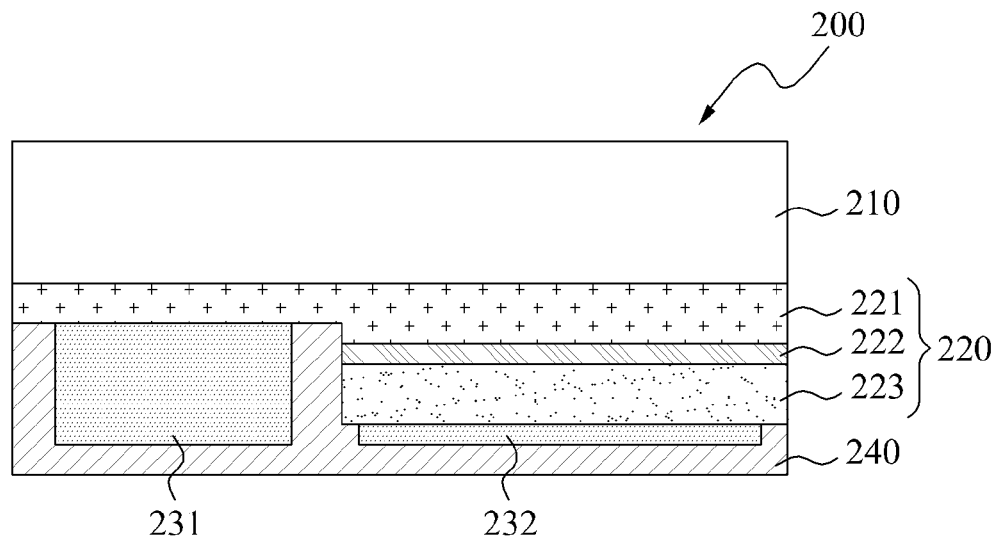
FIGS. 3 through 13 illustrate sectional diagrams explaining a manufacturing method for an LED package, according to example embodiments.
Figure 4:
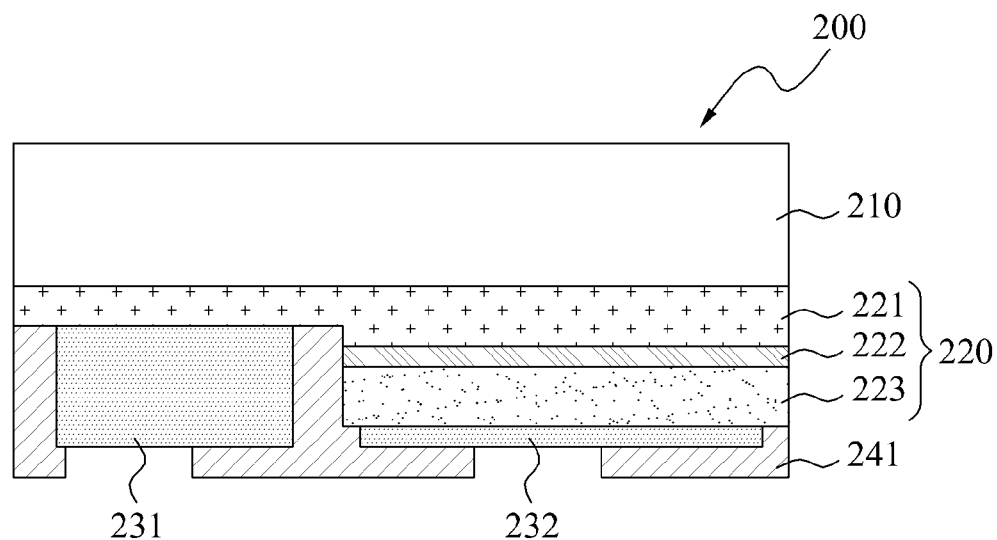

As shown in FIGS. 3 and 4, the LED package manufacturing method may include preparing a first substrate 200 including a plurality of LEDs. Each of the plurality of LEDs includes a first electrode pad 231 and a second electrode pad 232 disposed on one surface thereof. The first substrate 200 also includes a bonding insulating pattern layer 241 exposing the first electrode pad 231 and the second electrode pad 232. Hereinafter, one of the plurality of LEDs will be representatively described.

Referring to FIG. 3, a light emission structure 220 including a first nitride-based semiconductor layer 221, an active layer 222, and a second nitride-based semiconductor layer 223 is formed on a sapphire substrate 210. The active layer 222 and the second nitride-based semiconductor layer 223 are etched such that a part of the first nitride-based semiconductor layer 221 is exposed.

The LED is manufactured by forming the first electrode pad 231 on the first nitride-based semiconductor layer 221 and forming the second electrode pad 232 on the second electrode 223.

The one surface of the LED, where the first electrode pad 231 and the second electrode pad 232 are formed, may be coated with a bonding insulating material 240. Before the coating, one surface of the light emission structure 220 may be processed by oxygen plasma so that a bonding force of the bonding insulating material 240 is increased.

Referring to FIG. 4, the bonding insulating material 240 coating the one surface of the LED is patterned, thereby forming the bonding insulating pattern layer 241. The bonding insulating material 240 may contain a photoconductive or non-photoconductive polymer.

When the bonding insulating material 240 contains the photoconductive polymer, the bonding insulating pattern layer 241 may be formed by exposing and patterning a region corresponding to the first electrode pad 231 and the second electrode pad 232.

When the bonding insulating material 240 contains the non-photoconductive polymer, the bonding insulating pattern layer 241 may be formed by performing wet-etching or dry-etching so that the first electrode pad 231 and the second electrode pad 232 are exposed.

As shown in FIG. 4, the bonding insulating pattern layer 241 may be configured to expose only a partial region of the first electrode pad 231 and the second electrode pad 232, or to expose the entire region of the first electrode 231 and the second electrode pad 232.

According to the LED package manufacturing method as shown in FIGS. 5 through 8, a second substrate 300 is prepared to include a plurality of via holes, for example, via holes H1 and H2 bored from a first surface A to a second surface B of the second substrate 300, and a wiring metal layer 330 disposed on inner surfaces of the via holes H1 and H2 to extend to a part of the second surface B.

Figure 5:
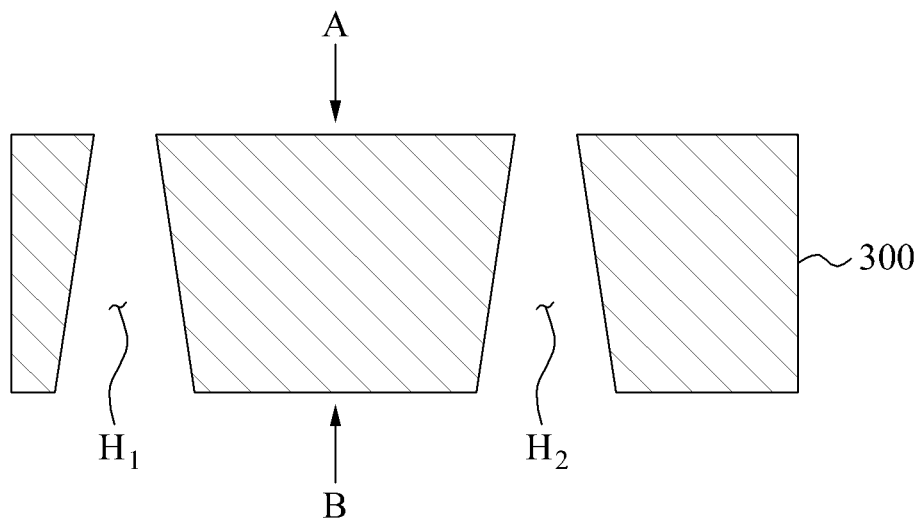

Referring to FIG. 5, the via holes H1 and H2 are formed by etching the second substrate 300. The second substrate 300 may be a conductive substrate such as a silicon wafer. The via holes H1 and H2 may be formed by performing wet-etching or dry-etching, for example plasma etching, with respect to the second substrate 300 in a vertical direction.

The etching of the second substrate 300 is performed so that inner diameters of the via holes H1 and H2 increase from the first surface A toward the second surface B by adjusting an etch rate and directivity. Specifically, the inner surfaces of the via holes H1 and H2 may have an inclination angle of about 65° to about 90°. In addition, the via holes H1 and H2 may be disposed in the region corresponding to the first electrode pad 231 and the second electrode pad 232 of the first substrate 200.

Figure 6:
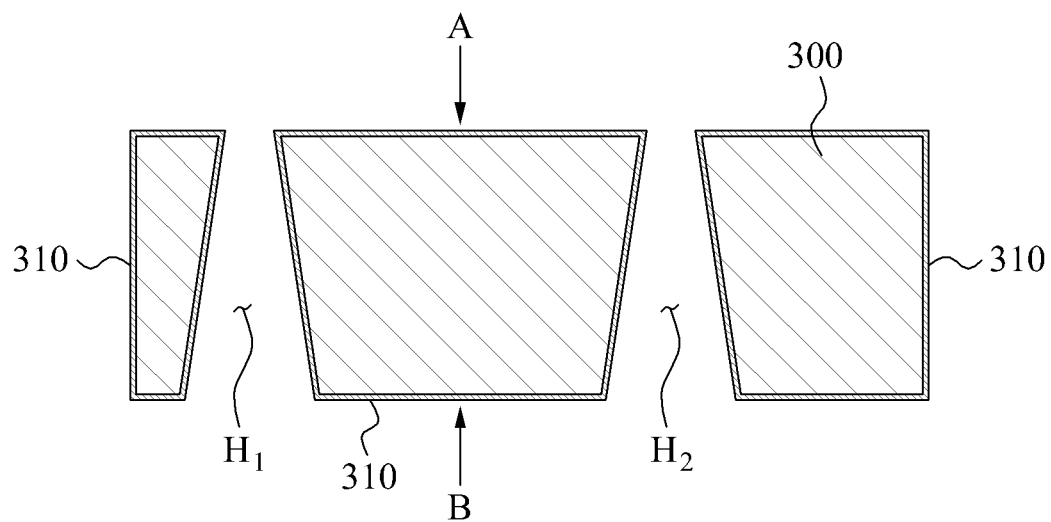

Referring to FIG. 6, an insulating layer 310 may be formed on a surface of the second substrate 300 that includes the via holes H1 and H2. When the second substrate 300 is a conductive substrate, the insulating layer 310 may be disposed on the first surface A, the second surface B, and the inner surfaces of the via holes H1 and H2 to achieve electrical insulation.

The insulating layer 310 may be manufactured by vapor-depositing a silicon oxide ($SiO_2$) or a silicon nitride ($SiN_x$) on the second substrate 300, by any of a thermal oxidation method, a low pressure chemical vapor deposition (LPCVD) method, a plasma enhanced CVD (PECVD) method, and the like.

Figure 7:
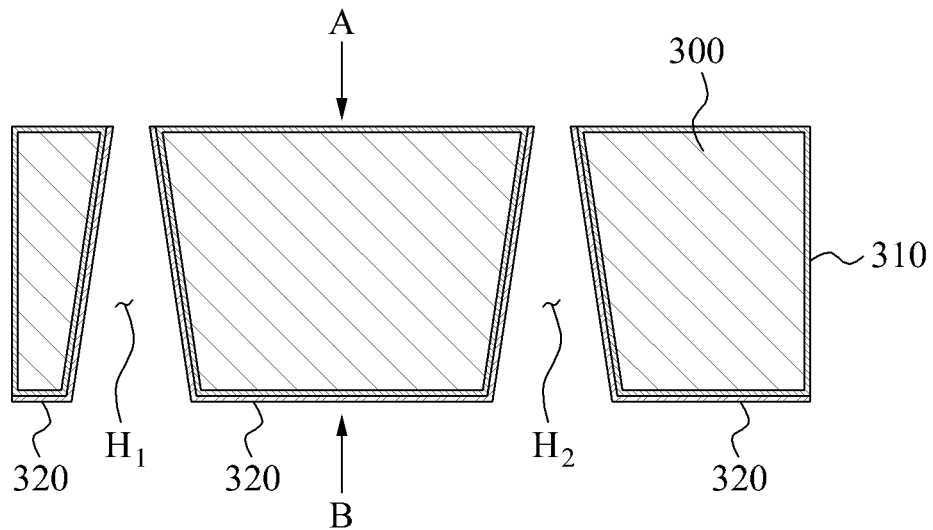

Referring to FIG. 7, a metal seed layer 320 may be disposed on the insulating layer 310 to extend from the inner surfaces of the via holes H1 and H2 up to the second surface B. More specifically, metal materials such as copper (Cu), nickel (Ni), tungsten (W), chrome (Cr), and the like may be vapor-deposited on the insulating layer 310 by sputtering, thereby forming the metal seed layer 320.

Figure 8:
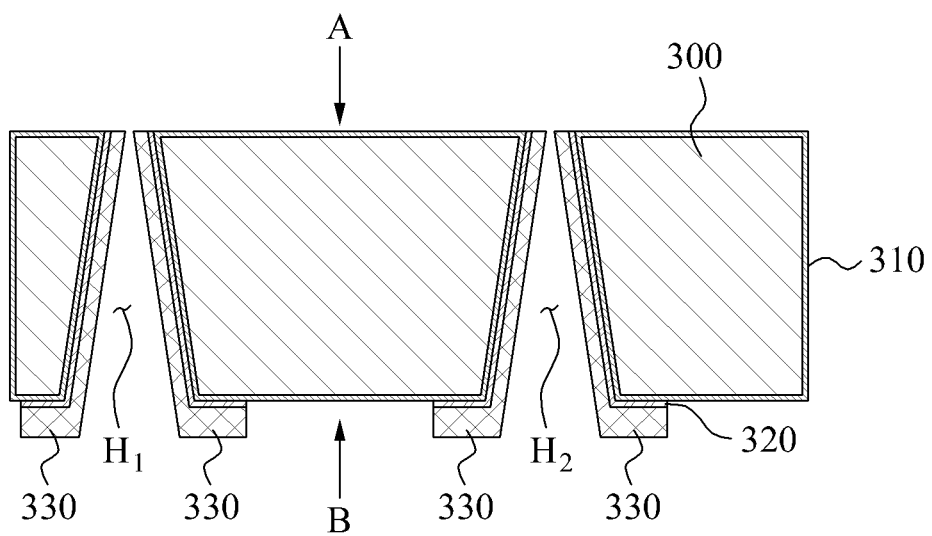

Referring to FIG. 8, a wiring metal layer 330 may be formed on the metal seed layer 320, by plating the metal seed layer 320 with a metal material. The wiring metal layer 330 may be disposed on the inner surfaces of the via holes H1 and H2 to extend to the part of the second surface B. The wiring metal layer 330 may be exposed through the via holes H1 and H2 at the first surface A of the second substrate 300.

In addition, the wiring metal layer 330 may be formed in a predetermined thickness on the metal seed layer 320, having the same shape as insides of the via holes H1 and H2.

The wiring metal layer 330 may be formed through the substrate 300 by extending from the first surface A to the second surface B in the same manner as the via holes H1 and H2, rather than filling the insides of the via holes H1 and H2.

After the wiring metal layer 330 is formed, the metal seed layer 320 exposed out of the wiring metal layer 330 may be removed.

Figure 9:
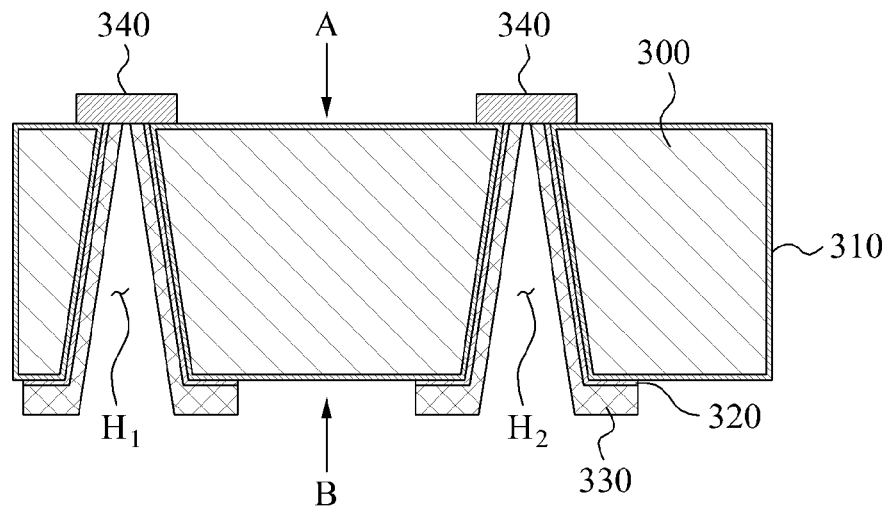

Referring to FIG. 9, according to the LED package manufacturing method, a bonding metal pattern layer 340 is formed on the first surface A of the second substrate 300. More specifically, the bonding metal pattern layer 340 is disposed in a region, including the via holes H1 and H2, on the first surface A of the second substrate 300, such that the bonding metal pattern layer 340 electrically and physically contacts the wiring metal layer 330 exposed through the via holes H1 and H2.

The bonding metal pattern layer 340 may be manufactured by vapor-depositing a metal material on a predetermined region by any of screen printing, electroplating, sputtering, and the like. When the screen printing is used, a metal complex having flexibility, such as a metal epoxy, may be used.

Figure 10:
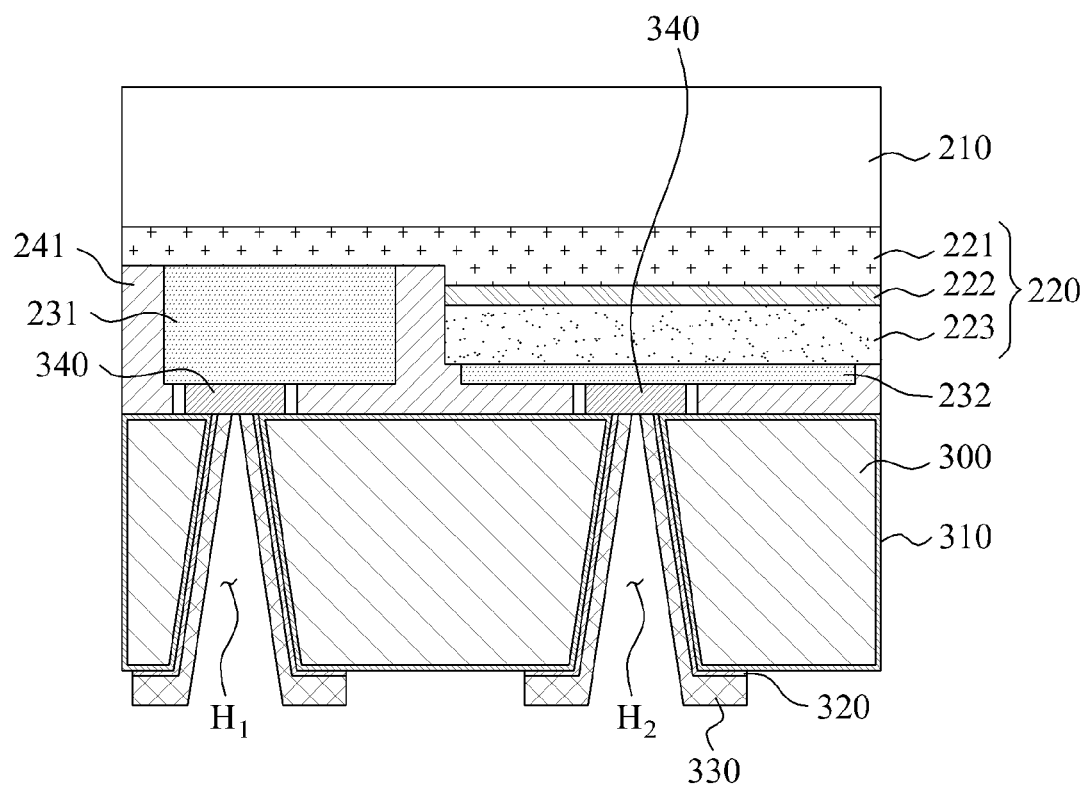

Referring to FIG. 10, the LED package manufacturing method according to the example embodiments may include mounting of the first substrate 200 shown in FIG. 4 to the second substrate 300 shown in FIG. 9. In this case, the first substrate 200 may be mounted on the second substrate 300 such that the first electrode pad 231 and the second electrode pad 232, of the first substrate 200, are bonded to the bonding metal pattern layer 340.

Specifically, the first substrate 200 may be mounted on the second substrate 300 such that the bonding insulating pattern layer 241 of the first substrate 200 is meshed with the bonding metal pattern layer 340 of the second substrate 300.

In a state where the first substrate 200 is mounted on the second substrate 300, an outer surface of the bonding metal pattern layer 340 may be separated from the bonding insulating pattern layer 241.

As shown in FIG. 10, in the state where the first substrate 20 is mounted on the second substrate 300, the bonding insulating pattern layer 241 is melted at a predetermined temperature and the first substrate 200 is pressed from an upper part and thereby bonded to the second substrate 300.

The bonding metal pattern layer 340 having flexibility is pushed by the pressing force to a space, generated by the predetermined interval, between the outer surface and the bonding insulating pattern layer 241, thereby being bonded to the bonding insulating pattern layer 241. Accordingly, the bonding metal pattern layer 340 and the bonding insulating pattern layer 241 may form a glue layer between the first substrate 200 and the second substrate 300.

Figure 11:
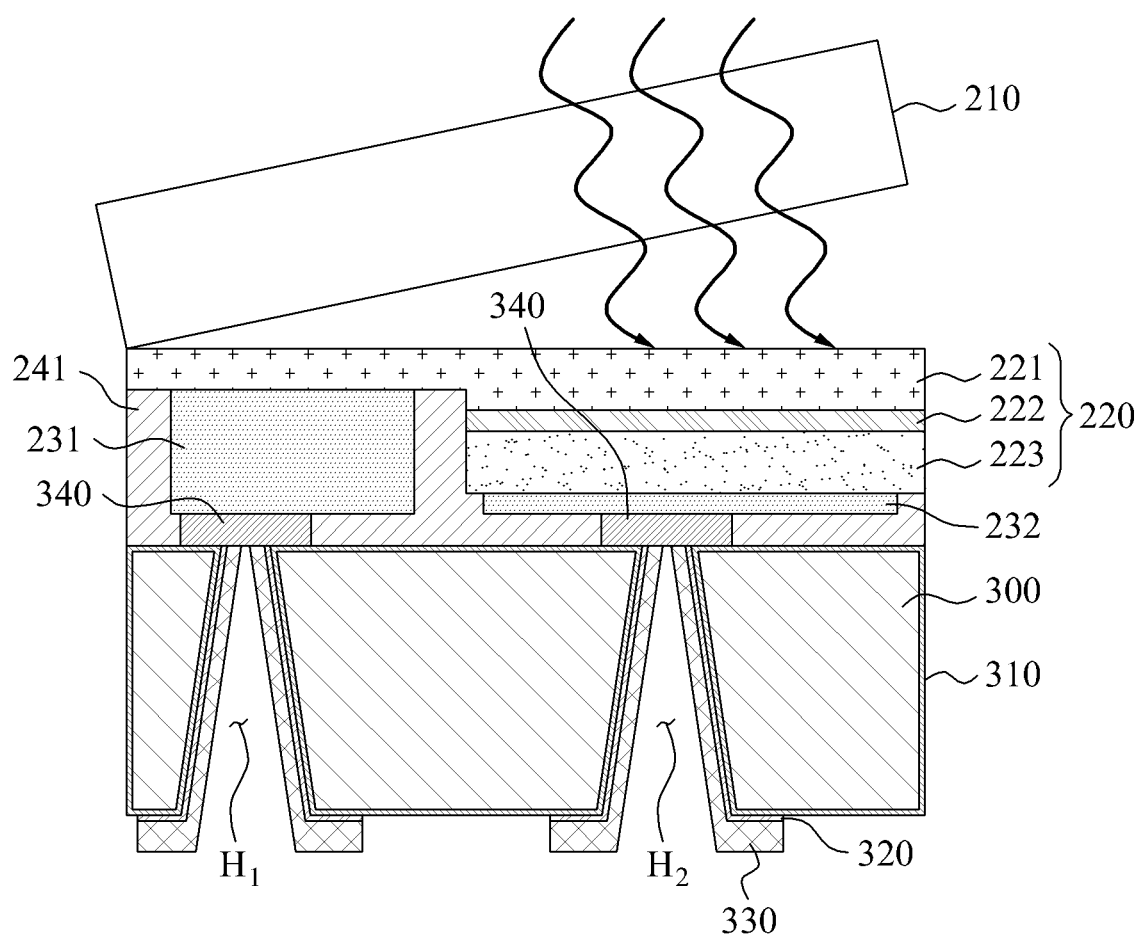

Referring to FIG. 11, the LED package manufacturing method may include removing the sapphire substrate 210 from the first substrate 200. The sapphire substrate 210 may be removed by a laser lift off method or a mechanical/chemical polishing method.

Figure 12:
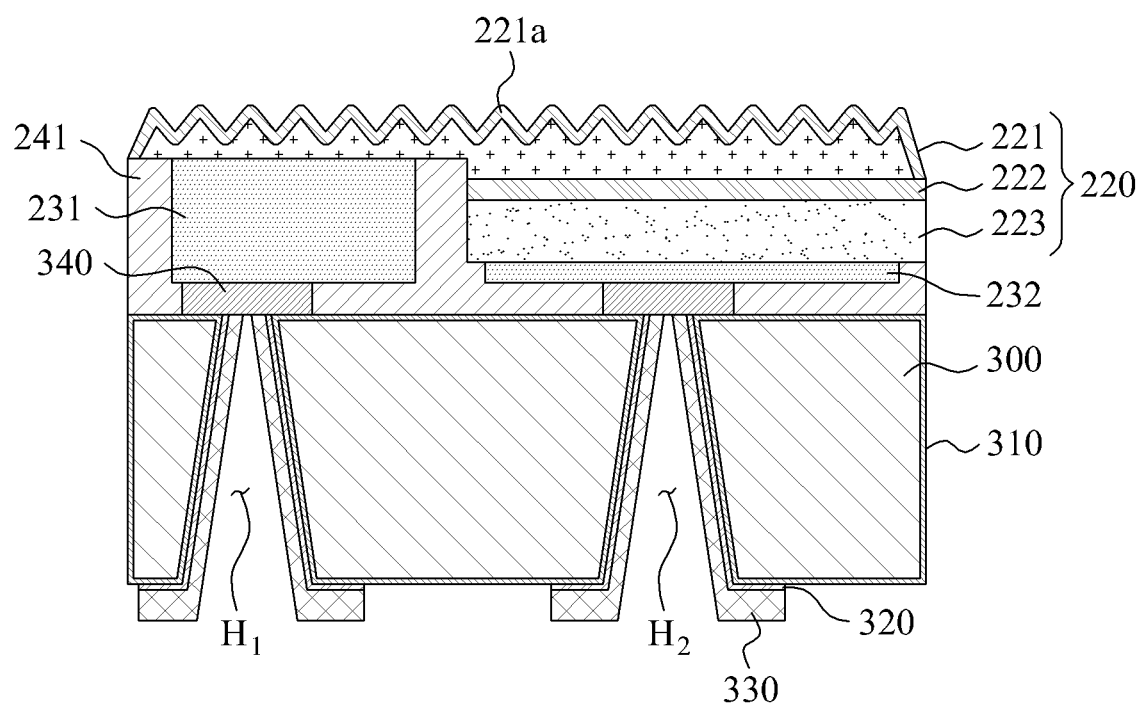

Referring to FIG. 12, the LED package manufacturing method may include forming an uneven surface pattern 221a on a light extraction surface of the first nitride-based semiconductor layer 221, the light extraction surface exposed as the sapphire substrate 210 is removed. The uneven surface pattern 221a may be formed by etching the first nitride-based semiconductor layer 221 using a potassium hydroxide (KOH) solution or by exposing. The uneven surface pattern 221a may increase the light extraction efficiency.

Additionally, although not shown, an insulating layer may be further provided on the uneven surface pattern 221a to improve electrical characteristics of the LED.

Figure 13:
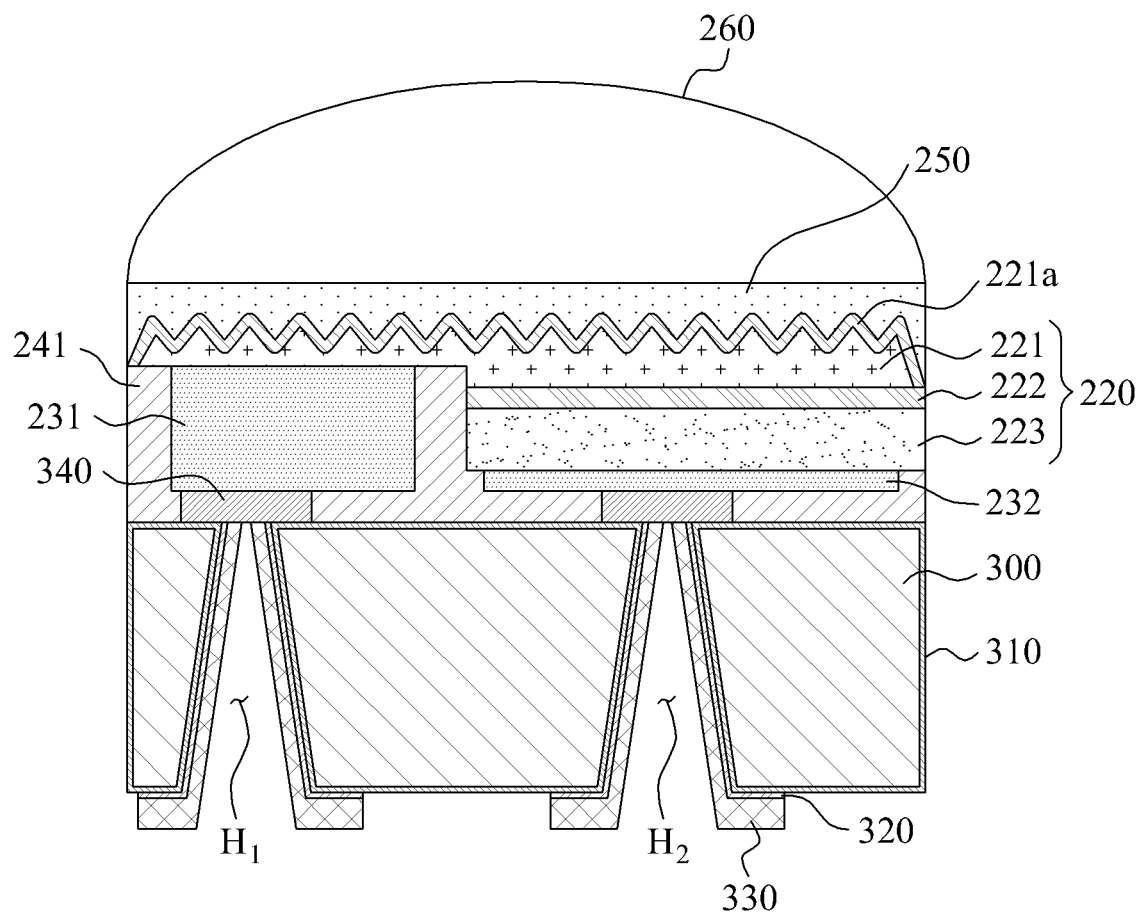

Referring to FIG. 13, the LED package manufacturing method may include forming a lens unit 260 by applying a transparent resin on a phosphor resin layer 250, formed by applying a phosphor resin on the first nitride-based semiconductor layer 221, including the uneven surface pattern 221a.

After the process shown in FIG. 13 is completed, the first substrate 200 and the second substrate 300 are cut and separated into unit chips, accordingly manufacturing the LED package. Thus, according to the LED package manufacturing method, the processes including mounting of the LED, bonding of the first substrate 200 and the second substrate 300, applying of the phosphor resin, and applying of the transparent resin are performed in a wafer level. Therefore, mass production of the LED package is facilitated. Also, the number of processes may be reduced, accordingly reducing processing cost and time.

Since the second substrate 300 functioning as a package body of the LED package has almost the same size (surface area) as the LED, size of the LED package may be reduced compared to a conventional art. Consequently, a degree of freedom in design of products may increase.

Although FIGS. 3 through 13 illustrate only the first substrate 200 and the second substrate 300 as a unit chip, practically, manufacturing of the LED package is performed at a wafer level.

Figure 14:
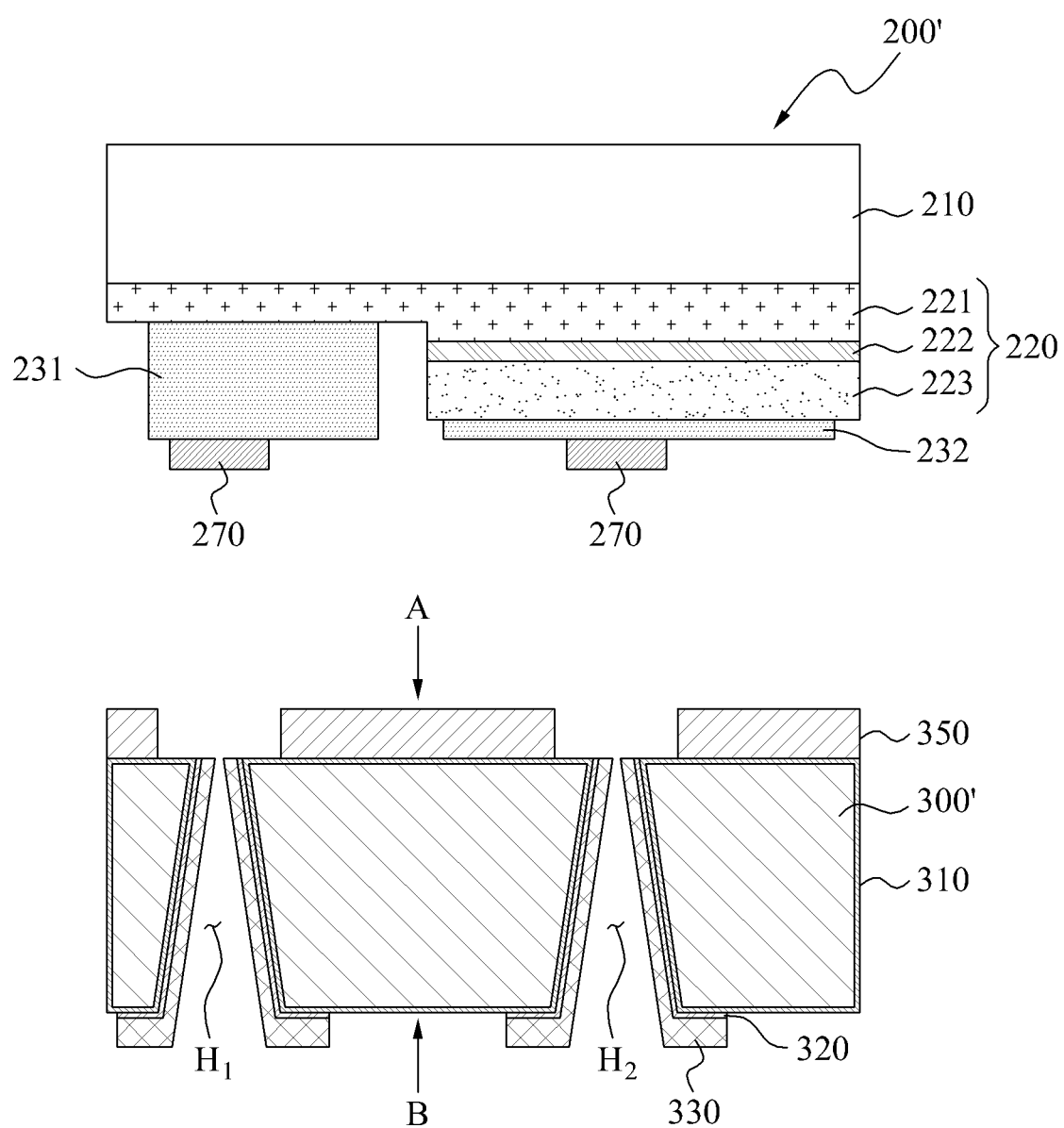
FIGS. 14 through 16 illustrate sectional diagrams explaining a manufacturing method for an LED package, according to other example embodiments.
Figure 15:
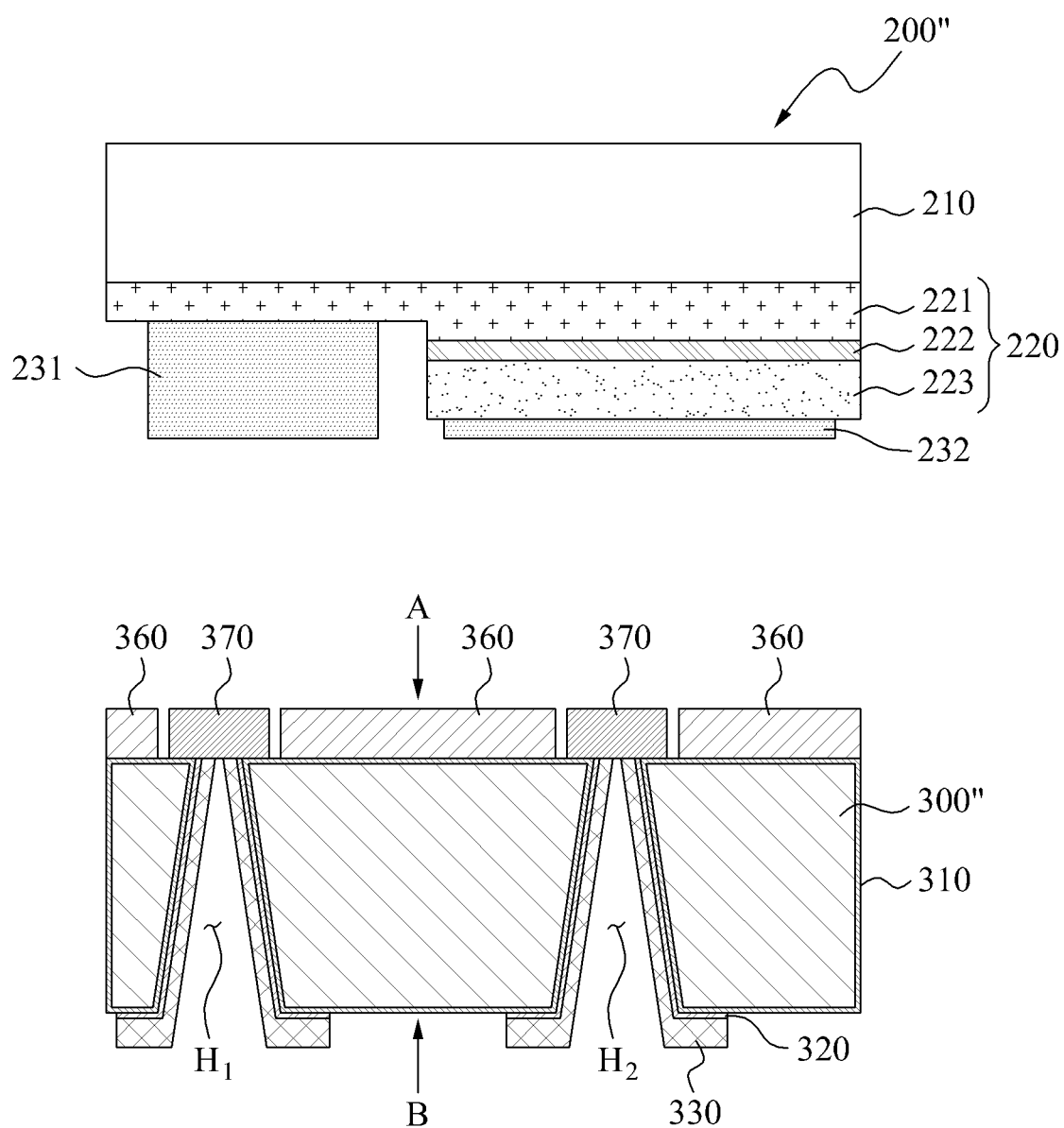
Figure 16:
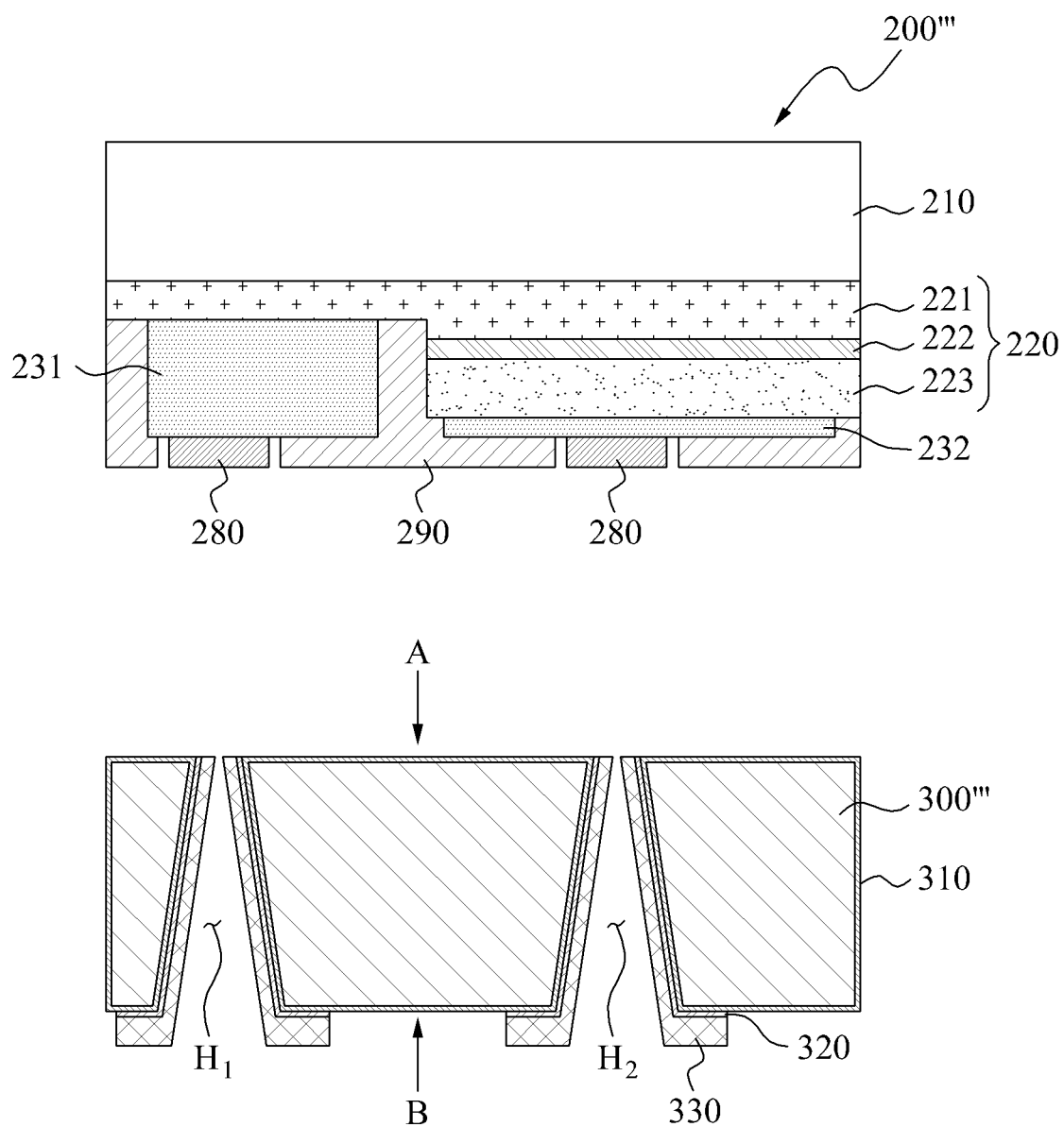

FIGS. 14 through 16 illustrate sectional diagrams explaining a manufacturing method for an LED package, according to other example embodiments. According to the LED package manufacturing method of FIGS. 3 through 13, the bonding insulating pattern layer 241 is formed on the first substrate 200, while the bonding metal pattern layer 340 is formed on the second substrate 300, for bonding of the first substrate 200 and the second substrate 300. However, substrates including the bonding insulating pattern layer 241 and the bonding metal pattern layer 340 are not limited to the illustrated embodiments.

In FIG. 14, a bonding metal pattern layer 270 is formed on a first substrate 200' and a bonding insulating pattern layer 350 is formed on a second substrate 300'.

Referring to FIG. 14, the first substrate 200' has almost the same configuration as the first substrate 200 of FIG. 3, except for the bonding metal pattern layer 270 included instead of the bonding insulating pattern layer 241. Specifically, the bonding metal pattern layer 270 may be formed by vapor-depositing a metal material on the first electrode pad 231 and the second electrode pad 232 of the first substrate 200' by any of screen printing, electroplating, sputtering, and the like.

A second substrate 300' may be achieved by forming the bonding insulating pattern layer 350 on the second substrate 300 shown in FIG. 8. Specifically, the bonding insulating pattern layer 350 may be formed by forming a bonding insulating material on the first surface A, of the second substrate 300', and patterning the bonding insulating material. In this case, the bonding insulating pattern layer 350 may be disposed in a region except the via holes H1 and H2 on the first surface A of the second substrate 300' and may be meshed with the bonding metal pattern layer 270 of the first substrate 200'.

After the first substrate 200' including the bonding metal pattern layer 270 is mounted on the second substrate 300', including the bonding insulating pattern layer 350, various processes including bonding, processing (for example, removal of the sapphire substrate 210, applying of a phosphor resin, and applying of a transparent resin), cutting, and the like are performed, accordingly manufacturing the LED package structured as shown in FIG. 13.

FIG. 15 illustrates example embodiments where a second substrate 300" includes a bonding metal pattern layer 370 and a bonding insulating pattern layer 380.

Referring to FIG. 15, a first substrate 200" may have almost the same structure as the first substrate 200 shown in FIG. 3, except that the bonding insulating pattern layer 241 is excluded. A second substrate 300" may have the same structure as the first substrate 200 shown in FIG. 9 and further include a bonding insulating pattern layer 360, disposed around the bonding metal pattern layer 370. In other words, the second substrate 300" may include both the bonding metal pattern layer 370 and the bonding insulating pattern layer 360 on the first surface A. The bonding metal pattern layer 370 and the bonding insulating pattern layer 360 may have different heights to facilitate the bonding. For example, the bonding insulating pattern layer 360 may be formed higher than the bonding metal pattern layer 370.

After the first substrate 200" is mounted on the second substrate 300" such that the first electrode pad 231 and the second electrode pad 232 are bonded to the bonding metal pattern layer 370 of the second substrate 300", processes including bonding, processing (for example, removal of the sapphire substrate 210, applying of the phosphor resin, and applying of the transparent resin), cutting, and the like are performed, accordingly manufacturing the LED package structured as shown in FIG. 13.

FIG. 16 illustrates example embodiments where a first substrate 200''' includes a bonding metal pattern layer 280 and a bonding insulating pattern layer 290.

Referring to FIG. 16, the first substrate 200''' may have the same structure as the first substrate 200 shown in FIG. 4 except that, the bonding metal pattern layer 280 is further provided around the bonding insulating pattern layer 290. In other words, differently from the structure shown in FIG. 15, the structure shown in FIG. 16 may include both the bonding metal pattern layer 280 and the bonding insulating pattern layer 290 on the first substrate 200'''.

After the first substrate 200''' is mounted on the second substrate 300''' such that the bonding metal pattern layer 280 and the bonding insulating pattern layer 290 face the first surface A of the second substrate 300''', processes including bonding, processing (for example, removal of the sapphire substrate 210, applying of the phosphor resin, and applying of the transparent resin), cutting, and the like are performed, accordingly manufacturing the LED package structured as shown in FIG. 13.

According to the above embodiments, since the manufacturing processes are performed in a wafer level, size reduction of the products may be achieved while simplifying the processes. According to the size reduction, a degree of freedom in design of the products applying the LED package may be increased.

In addition, since a first substrate including an LED and a second substrate including a wiring metal layer are bonded using a bonding insulating pattern layer formed on an outer surface of a bonding metal pattern layer, a stress caused by a difference in thermal coefficients between the first substrate and the second may be reduced, thereby increasing bonding reliability.

Also, manufacturing of the wiring metal layer may be easily performed by forming a plurality of via holes having an inclination angle of about 65° to about 90° on the second substrate. In addition, since the wiring metal layer is formed in the same shape as insides of the via holes, a residual stress remaining on the second substrate and out-gassing may be reduced.

Although example embodiments have been shown and described, it would be appreciated by those skilled in the art that changes may be made in these example embodiments without departing from the principles and spirit of the disclosure, the scope of which is defined in the claims and their equivalents.

What is claimed is:

1. A method for manufacturing a light emitting device (LED) package, comprising steps of:
    preparing a first substrate that comprises a sapphire substrate, an LED on the sapphire substrate formed with a first electrode pad and a second electrode pad disposed on one surface of the LED, and a bonding insulating pattern layer exposing the first electrode pad and the second electrode pad;
    preparing a second substrate that comprises a plurality of via holes bored from a first surface to a second surface, and a wiring metal layer formed on inner surfaces of the plurality of via holes, extending to a part of the second surface;
    forming a bonding metal pattern layer to be bonded to the wiring metal layer exposed through the plurality of via holes at the first surface of the second substrate;
    mounting the first substrate to the second substrate such that the first electrode pad and the second electrode pad face the bonding metal pattern layer;
    bonding the first substrate and the second substrate by melting the bonding insulating pattern layer at a predetermined temperature and pressing the first substrate from an upper part;
    forming an uneven surface pattern on the first substrate by removing the sapphire substrate and etching an exposed surface of the first substrate;
    forming an insulating layer and a phosphor resin layer sequentially on the uneven surface pattern of the first substrate; and
    manufacturing the LED package separated into unit chips by processing the first substrate and the second substrate, so that a size of the bonding insulating pattern layer is substantially the same as a size of the second substrate,
    wherein the step of preparing the first substrate comprises:
        forming a light emission structure comprising a first nitride-based semiconductor layer, an active layer, and a second nitride-based semiconductor layer, on the sapphire substrate;
        etching the active layer and the second nitride-based semiconductor layer so that a part of the first nitride-based semiconductor layer is exposed;
        forming the first electrode pad on the first nitride-based semiconductor layer and forming the second electrode pad on the second nitride-based semiconductor layer;
        after processing by oxygen plasma one surface of the light emission structure where the first electrode pad and the second electrode pad are formed, coating a bonding insulating material to cover the first electrode pad and the second electrode pad on one surface where the first electrode pad and the second electrode pad are formed; and
        forming the bonding insulating pattern layer by patterning the bonding insulating material so that the first electrode pad and the second electrode pad are exposed.

2. The method of claim 1, wherein the manufacturing of the LED package separated into unit chips, comprises:
    applying a transparent resin on the phosphor resin; and
    cutting the first substrate and the second substrate into separate unit chips.

3. The method of claim 1, wherein the preparing of the second substrate comprises:
- forming the plurality of via holes by etching a conductive substrate;
- forming an insulating layer on a surface of the conductive substrate formed with the plurality of via holes;
- forming a metal seed layer on the insulation layer, the metal seed layer extending from an inner surface of each of the plurality of via holes to the second surface; and
- forming the wiring metal layer by plating the metal seed layer with a metal material extending from an inner surface of each of the plurality of via holes to a part of the second surface.

4. The method of claim 1, wherein the plurality of via holes each have a diameter increasing from the first surface toward the second surface such that the inner surface has an inclination angle of about 65° to about 90°.

5. The method of claim 3, wherein the forming of the wiring metal layer plates the metal seed layer with a uniform thickness of the metal material into the same shape as an inside of each of the plurality of via holes.

6. The method of claim 1, wherein the forming of the bonding metal pattern layer is performed such that the bonding metal pattern layer is meshed with the first electrode pad and the second electrode pad exposed through the bonding insulating pattern layer at the first substrate and such that an outer surface of the bonding metal pattern layer is separated from the bonding insulating pattern layer.

* * * * *